(12) United States Patent
Susukida et al.

(10) Patent No.: US 6,391,513 B1
(45) Date of Patent: May 21, 2002

(54) POSITIVELY PHOTOSENSITIVE RESIN COMPOSITION

(75) Inventors: Kenji Susukida; Masato Nishikawa, both of Shizuoka; Akio Arano, Minoo, all of (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/647,306

(22) PCT Filed: Jan. 13, 2000

(86) PCT No.: PCT/JP00/00129

§ 371 Date: Mar. 16, 2001

§ 102(e) Date: Mar. 16, 2001

(87) PCT Pub. No.: WO00/45223

PCT Pub. Date: Aug. 3, 2000

(30) Foreign Application Priority Data

Jan. 27, 1999 (JP) ............................................. 11-17832

(51) Int. Cl.$^7$ .............................................. G03F 7/021

(52) U.S. Cl. ........................ 430/190; 430/192; 430/193

(58) Field of Search ................................ 430/190, 192, 430/193

(56) References Cited

U.S. PATENT DOCUMENTS

| | | | | | |
|---|---|---|---|---|---|
| 4,847,178 | A | * | 7/1989 | Komano | 430/165 |
| 5,279,918 | A | * | 1/1994 | Nishi et al. | 430/165 |
| 5,422,221 | A | * | 6/1995 | Okazaki et al. | 430/165 |
| 5,437,952 | A | * | 8/1995 | Hirai et al. | 430/165 |
| 5,478,691 | A | * | 12/1995 | Miyashita et al. | 430/165 |
| 5,529,880 | A | * | 6/1996 | Zampini et al. | 430/190 |
| 5,635,329 | A | * | 6/1997 | Nishi et al. | 430/165 |
| 5,639,587 | A | * | 6/1997 | Sato et al. | 430/190 |
| 5,660,967 | A | * | 8/1997 | Nishi et al. | 430/190 |
| 5,695,906 | A | * | 12/1997 | Nishi et al. | 430/190 |
| 5,932,396 | A | * | 8/1999 | Kamijima | 29/603.07 |

* cited by examiner

*Primary Examiner*—John S. Chu
(74) *Attorney, Agent, or Firm*—Sangya Jain

(57) ABSTRACT

The positive-working radiation sensitive resin composition which has high sensitivity, high resolution and no residues in development and ability to form a pattern having a good profile. The positive-working radiation sensitive resin composition contains a mixed radiation sensitive novolak resin comprising the mixture of 1,2-naphthoquinonediazide-4-sulfonic acid ester of an alkali soluble novolak resin and 1,2-naphthoquinonediazide-5-sulfonic acid ester of an alkali soluble novolak resin, wherein the ratio by weight of the 1,2-naphthoquinonediazide-4-sulfonyl group and 1,2-naphthoquinonediazide-5-sulfonyl group ranges from 5:95 to 20:80.

2 Claims, No Drawings

POSITIVELY PHOTOSENSITIVE RESIN COMPOSITION

TECHNICAL FIELD

This invention relates to a novel positive-working radiation sensitive resin composition and, more particularly, to a positive-working radiation sensitive resin composition containing a radiation sensitive novolak resin, suited for manufacture of a semiconductor integrated circuit, production of a display surface of a liquid crystal display device in a LCD panel, manufacture of a circuit substrate for a thermal head etc., and like use.

BACKGROUND ART

In the wide field of manufacturing a semiconductor integrated circuit such as a LSI, preparing a display surface of a liquid crystal display device in a LCD panel, manufacturing a circuit substrate for a thermal head etc., and like use, photolithography has so far been employed for forming microelements or conducting fine processing. In the photolithography, a positive- or negative-working radiation sensitive resin composition is used for forming a resist pattern. Of these radiation sensitive resin compositions, those compositions containing an alkali-soluble resin and a photosensitizer of quinonediazide compound are most popularly used as the positive-working radiation sensitive resin compositions. As such compositions, there are described compositions having different formulations as, for example, 'novolak resin/quinonediazide compound' in many documents such as Japanese Examined Patent Publication Nos. S54-23570 (U.S. Pat. No. 3,666,473) and S56-30850 (U.S. Pat. No. 4,115,128), Japanese Unexamined Patent Publication Nos. S55-73045, S61-205933 and S62-51459, etc.

These compositions containing a novolak resin and a quinonediazide compound have so far been studied from the viewpoint of both novolak resins and photosensitizers. From the viewpoint of a novolak resin, there have been developed novel resins. In addition, radiation sensitive resin compositions having excellent properties have also been obtained by improving properties of conventionally known resins. For example, there are disclosed techniques providing a radiation sensitive resin composition having excellent properties by using a novolak resin with a particular molecular weight distribution in Japanese Unexamined Patent Publication Nos. S60-140235 and H1-105243 and by using a novolak resin from which low-molecular-weight components of the resin has been removed by fractionation in Japanese Unexamined Patent Publication Nos. S60-97347 and S60-189739 and Japanese Patent Publication No.2590342. From the viewpoint of a photosensitizer, various attempts have been made to develop novel quinonediazide compounds and novel quinonediazide sulfonates. Further, there have been proposed the improvement of the characteristics by a combination of a specific novolak resin and a quinone diazide sulfonate (e.g. Japanese Unexamined Patent Publication H9-90622) or a combination of a specific dissolution promoter and a quinonediazide sulfonate of an alkali- soluble resin such as novolak resin (e.g. Japanese Unexamined Patent Publication No.H10-69077). Above-mentioned Japanese Unexamined Patent Publication Nos. H9-90622 and H10-69077 describe generally that quinonediazide sulfonates are formed by use of quinonediazide compounds having a sulfonic acid group at the 4- or 5-position, and further that such sulfonates of quinonediazide compounds having a sulfonic acid group at the 4- or 5-position are used in combination, but there is no specific disclosure therein on the combined use thereof such as an effect when used in combination thereof, a mixing ratio thereof, and Examples.

A number of positive-working radiation sensitive resin compositions containing quinonediazide compounds have been put into practice as a result of various technical developments having so far been made, and the aspect ratio of thickness of radiation sensitive resin coating to line width resolved has been improved to about 5:1 .

On the other hand, degree of integration of semiconductor integrated circuits have been increased year by year and, in the manufacture thereof, processing of patterns with a line width of less than sub-micron order has become required. In the uses requiring such super-fine processing, good pattern reproducibility is required as well as high resolution and, from the standpoint of production cost, it is also required to improve throughput (yield per unit time) upon production by meeting the high sensitization. However, conventionally known radiation sensitive resin compositions can not satisfy these requirements at the same time, thus being a problem.

Under the circumstances with problems described above, an object of the present invention is to provide a positive-working radiation sensitive resin composition which has high sensitivity and high resolution and can form a good pattern.

DISCLOSURE OF THE INVENTION

As a result of intensive investigation, the inventors have found that in a positive-working radiation sensitive resin composition comprising a radiation sensitive novolak resin consisting of esterified products between an alkali-soluble novolak resin and naphthoquinonediazide compounds, if said radiation sensitive novolak resin consists of two kinds of esterified products between an alkali-soluble novolak resin and naphthoquinonediazide compounds different in the substitution position of the sulfonic acid group and the mixing ratio of the substituent group is in a specific range, the resulting positive-working radiation sensitive resin composition has high sensitivity, high resolution and ability to form excellent patterns, which cannot be predicted from the prior art, thus having completed the present invention based on the finding.

That is, the present invention relates to a positive-working radiation sensitive resin composition comprising partially esterified products (radiation sensitive novolak resin) between an alkali-soluble novolak resin and o-naphthoquinonediazide compounds, wherein said partially esterified products comprise 1,2-naphthoquinonediazide-4-sulfonic acid ester and 1,2-naphthoquinonediazide-5-sulfonic acid ester, and the ratio by weight of 4-sulfonyl group and 5-sulfonyl group bound to said partially esterified products ranges from 5:95 to 20:80.

The present invention will now be described more specifically below.

An alkali-soluble novolak resin used as a starting material for preparing the radiation sensitive novolak resin of the present invention is a novolak-type phenol resin, and is manufactured by polycondensation between one of phenols or a mixture thereof and an aldehyde such as formalin. The polycondensation between a phenol and an aldehyde may be conducted by any conventionally known processes such as using oxalic acid as a catalyst.

The alkali-soluble novolak resin may be the one from which low-molecular components were removed by suitable fractionation treatment such as re-precipitation. The removal of low-molecular components is conducted usually before the reaction between the alkali-soluble novolak resin and the naphthoquinonediazide compounds. Alternatively, after the reaction of the alkali-soluble novolak resin and the naphthoquinonediazide compounds, the reaction products may be treated in the same manner as in the above-mentioned fractionation treatment of the novolak resin, so that low-molecular components are removed from the reaction products, and the radiation sensitive novolak resin thus obtained is similar to the one obtained from the novolak resin from which low-molecular components were previously removed. However, from the viewpoint of safety and because of the possible inactivation of the radiation sensitive functional groups by heating at the time of fractionation treatment, the fractionation treatment is conducted preferably before the reaction. If the novolak resin from which low-molecular components were removed by fractionation treatment is used, desired resolution may not be achieved, so a predetermined dissolution inhibitor is preferably blended with it.

In the present invention, there are preferably used an alkali-soluble novolak resin having a dissolution rate of 10 to 300 Å/sec, for a 2.38 wt% aqueous solution of tetramethylammonium hydroxide measured according to the following "method of measuring dissolution rate of novolak resin". If the dissolution rate of the alkali-soluble novolak resin is less than 10 Å/sec, such novolak resin can cause reduction in sensitivity and remaining of indissoluble substances. In addition, it is difficult to attain high resolution by use of such novolak resin. If the dissolution rate is more than 300 Å/sec, such novolak resin is not preferable for the resist pattern by reason of much decrease in resist film thickness after development, and it is difficult to obtain resist patterns with good reproducibility and a good profile of patterns by use of such novolak resin. (Method of measuring dissolution rate of novolak resin)

20 g of novolak resin is dissolved in 80 g of a mixed solvent of ethyl lactate/n-butyl acetate (85/15), then filtered through a 0.5 $\mu$m Teflon filter. The resulting resin solution is applied on a HMDS-treated 4-inch silicon wafer using a spin coater, LARC ULTIMA-1000 made by Lithotec Japan Co. and baked at 100° C. for 90 seconds on a hot plate to form a 1$\mu$m-thick resist coating. Thickness of the coating is accurately measured by means of an apparatus for measuring film thickness, Lambda Ace made by Dainippon Screen Co., Ltd. Thereafter, the thus obtained silicon wafer is dipped in an alkaline developer solution, AZ® 300MIF Developer (a 2.38 wt % aqueous solution of tetramethylammonium hydroxide) made by Clariant (Japan) K.K. at 23 ° C., and the time necessary for the resin coating on the wafer to be completely dissolved is measured. Dissolution rate of novolak resin is calculated from the coating thickness and the dissolution time thus measured.

As the phenols to be used for manufacturing above-described alkali-soluble novolak resins, there maybe illustrated cresols such as o-cresol, p-cresol and m-cresol; xylenols such as 3,5-xylenol, 2,5-xylenol, 2,3-xylenol and 3,4-xylenol; trimethylphenols such as 2,3,4-trimethylphenol, 2,3,5-trimethylphenol, 2,4,5-trimethylphenol and 3,4,5-trimethylphenol; t-butylphenols such as 2-t-butylphenol, 3-t-butylphenol and 4-t-butylphenol; methoxyphenols such as 2-methoxyphenol, 3-methoxyphenol, 4-methoxyphenol, 2,3-dimethoxyphenol, 2,5-dimethoxyphenol and 3,5-dimethoxyphenol; ethylphenols such as 2-ethylphenol, 3-ethylphenol, 4-ethylphenol, 2,3-diethylphenol, 3,5-diethylphenol, 2,3,5-triethylphenol and 3,4,5-triethylphenol; chlorophenols such as o-chlorophenol, m-chlorophenol, p-chlorophenol and 2,3-dichlorophenol; resorcinols such as resorcinol, 2-methylresorcinol, 4-methylresorcinol and 5-methylresorcinol; catechols such as 5-methylcatechol; pyrogallols such as 5-methylpyrogallol; bisphenols such as bisphenol A, B, C, D, E or F; methylol-cresols such as 2,6-dimethylol-p-cresol; naphthols such as α-naphthol, β-naphthol, etc.; and the like. These are used independently or as a mixture of two or more thereof.

As the aldehydes, there may be used salicylaldehyde, paraformaldehyde, acetaldehyde, benzaldehyde, hydroxybenzaldehyde, chloroacetaldehyde, etc. as well as formalin. These are used independently or as a mixture of two or more thereof.

On the other hand, 1,2-naphthoquinonediazide-4-sulfonic acid esters and 1,2-naphthoquinonediazide-5-sulfonic acid esters constituting the radiation sensitive novolak resin of the present invention can be produced in an arbitrary method known in the art. These are produced generally by dissolving, in a solvent, 1,2-naphthoquinonediazide-4-sulfonyl halide and/or 1,2-naphthoquinonediazide-5-sulfonyl halide along with the alkali-soluble novolak resin described above, followed by introducing a base such as triethylamine into the mixture. Because the reaction proceeds almost quantitatively, the amount of 1,2-naphthoquinonediazide-4-sulfonyl halide or 1,2-naphthoquinone diazide-5-sulfonyl halide used in the reaction system can be regulated to control the amount of the ester substituent groups.

Preferable examples of 1,2-naphthoquinonediazide-4-sulfonyl halides includes 1,2-naphthoquinonediazide-4-sulfonyl chloride and preferable examples of 1,2-naphthoquinonediazide-5-sulfonyl halides include 1,2-naphthoquinonediazide-5-sulfonyl chloride in the present invention.

As to reaction substitution ratio of the naphtoquinonediazide compound to the alkali-soluble novolak resin, 3.5 to 25 mol % based on hydrogen atom of hydroxyl group of said novolak resin is preferred, with 4 to 15 mol % being more preferred. If the reaction substitution ratio is less than 3.5 mol %, intended resolution is hardly attained, whereas if more than 25 mol %, there results a positive pattern with development residues and tends to form a worse pattern profile.

In the present invention, the 1,2-naphthoquinonediazide-4-sulfonyl group and 1,2-naphthoquinonediazide-5-sulfonyl group described above are preferably used as a mixture in a ratio by weight of from 5:95 to 20:80. If the ratio of the 1,2-naphthoquinone diazide-4-sulfonyl group is less than 5%, the resulting composition is poor in resolution, and during development, scum is generated and the microgrooving characteristics are deteriorated. On the other hand, if the ratio of the 1,2-naphthoquinonediazide-4-sulfonyl group exceeds 20%, the shape of patterns is deteriorated. The mixture of 1,2-naphthoquinonediazide-4-sulfonic acid ester and 1,2-naphthoquinonediazide-5-sulfonic acid ester can be produced by separately reacting each of their corresponding naphthoquinonediazide compounds with the novolak resin to produce 1,2-naphthoquinonediazide-4-sulfonic acid ester or 1,2-naphthoquinonediazide-5-sulfonic acid ester followed by mixing thereof, or by allowing the naphthoquinonediazide compounds previously mixed in a predetermined ratio to react with the novolak resin. However, it is preferable to use the former method wherein 1,2-naphthoquinonediazide-4-sulfonic acid ester and 1,2-naphthoquinonediazide-5-sulfonic acid ester are separately produced and then mixed.

The solvent for dissolving the radiation sensitive novolak resin of the present invention includes ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactates such as methyl lactate and ethyl lactate; aromatic hydrocarbons such as toluene andxylene; ketones such as methyl ethyl ketone, 2-heptanone and cyclohexanone; amides such as N,N-dimethylacetamide and N-methylpyrrolidone; and lactones such as γ-butyrolactone. These solvents can be used independently or as a mixture of two or more thereof.

A photosensitizer containing a quinonediazide group other than 1,2-naphthoquinonediazide-4-sulfonic acid ester and 1,2-naphthoquinonediazide-5-sulfonic acid ester described above may be incorporated into the positive-working radiation sensitive resin composition of the present invention as necessary. These photosensitizers are obtained by allowing naphthoquinonediazidesulfonyl halide or benzoquinonediazidesulfonyl halide to react with a low-molecular or high-molecular compound having a functional group capable of condensation reaction with these sulfonyl halides. The functional group that can be condensed with a sulfonyl halide includes a hydroxyl group, an amino group etc. Among these, a hydroxyl group is particularly preferable. The compounds containing a hydroxyl group include e.g. hydroquinone; resorcinol; hydroxybenzophenones such as 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone and 2,2',3,4,6'-pentahydroxybenzophenone; hydroxyphenylalkanes such as bis(2,4-dihydroxyphenyl)methane, bis(2,3,4-trihydroxyphenyl)methane and bis(2,4-dihydroxyphenyl) propane; and hydroxytriphenylmethanes such as 4,4',3",4"-tetrahydroxy-3,5,3',5'-tetramethylphenylmethane and 4,4', 2",3",4"-pentahydroxy-3,5,3',5'-tetramethyltriphenylmethane. These can be used independently or as a combination of two or more thereof.

A low-molecular compound which has a phenolic hydroxyl group or groups may be incorporated as a dissolution inhibitor of a radiation sensitive resin composition in the positive-working radiation sensitive resin composition of the present invention. And there are illustrated, for example, 4,4',4"-methylidinetrisphenol, 2,6-bis[(2-hydroxy-5-methylphenyl)methyl]-4-methylphenol, 4,4'-[1-[4-[1-(4-hydroxyphenyl)-1-methylethyl]phenyl]ethylidene] bisphenol, 4,4',4"-ethylidinetrisphenol, 4-[bis(4-hydroxyphenyl)methyl]-2-ethoxyphenol, 4,4'-[(2-hydroxyphenyl)methylene]bis[2,3-dimethylphenol], 4,4'-[(3-hydroxyphenyl)methylene]bis[2,6-dimethylphenol], 4,4'-[(4-hydroxyphenyl)methylene]bis[2,6-dimethylphenol], 2,2'-[(2-hydroxyphenyl)methylene]bis[3,5-dimethylphenol], 2,2'-[(4-hydroxyphenyl)methylene]bis [3,5-dimethylphenol], 4,4'-[(3,4-dihydroxyphenyl) methylene]bis[2,3,6-trimethylphenol], 4-[bis(3-cyclohexyl-4-hydroxy-6-methylphenyl)methyl]-1,2-benzenediol, 4,6-bis[(3,5-dimethyl-4-hydroxyphenyl)methyl]-1,2,3-benzenetriol, 4,4'-[(2-hydroxyphenyl)methylene]bis[3-methylphenol], 4,4',4"-(3-methyl-1-propanyl-3-ylidine) trisphenol, 4,4',4",4'"-(1,4-phenylenedimethylidine) tetrakisphenol, 2,4,6-tris[(3,5-dimethyl-4-hydroxyphenyl) methyl]-1,3-benzenediol, 2,4,6-tris[(3,5-dimethyl-2-hydroxyphenyl)methyl]-1,3-benzenediol, 4,4'-[1-[4-[1-[4-hydroxy-3,5-bis[(hydroxy-3-methylphenyl)methyl ]phenyl]-1-methylethyl]phenyl]ethylidene]bis[2,6-bis (hydroxy-3-methylphenyl)methyl]phenol, and the like. If these low-molecular compounds having phenolic hydroxyl group or groups are used, they are used in an amount of usually 2 to 20 parts by weight relative to 100 parts by weight of the radiation sensitive novolak resin.

Dyestuffs, adhesive aids, surfactants etc. conventionally used as additives of the positive-working radiation sensitive resin composition may be incorporated as necessary into the positive-working radiation sensitive resin composition of the present invention. The dyestuffs include e.g. Methyl Violet, Crystal Violet, Malachite Green etc.; the adhesive aids include e.g. alkyl imidazoline, butyric acid, alkyl acid, polyhydroxystyrene, polyvinylmethyl ether, t-butyl novolak, epoxy silane, epoxy polymer, silane etc.; and the surfactants include e.g. nonionic surfactants such as polyglycols and derivatives thereof such as polypropylene glycol, polyoxyethylene lauryl ether etc., fluorine-containing surfactants such as Fluorad (trade name; manufactured by Sumitomo 3M Ltd.), Megafac (trade name; manufactured by Dainippon Ink & Chemicals, Inc.), Sulflon (trade name; manufactured by Asahi Glass Co., Ltd.) or organosiloxane surfactants such as KP341 (trade name; Shin-Etsu Chemical Co., Ltd.).

Furthermore, the positive-working radiation sensitive resin composition of the present invention may be used in combination with an inorganic anti-reflective coating of TiN, SiN, SiON or the like or an organic anti-reflective coating of AZ® BARLi, AZ® BARLi II (manufactured by Clariant (Japan) K.K.).

The positive-working radiation sensitive resin composition of the present invention is applied on a substrate such as a silicon wafer having an anti-reflective coating thereon, by spin coating or the like, and the substrate on which the radiation sensitive resin composition has been coated is subjected to baking to form a radiation sensitive resin coating. The substrate having thereon the radiation sensitive resin coating is exposed with radiation such as ultraviolet rays, deep ultraviolet rays, X-rays or electron beams and is developed with an alkaline developing solution to form a resist pattern with high resolution and good pattern profile.

EXAMPLES

The present invention will now be described specifically by reference to Examples which, however, are not to be construed to limit the present invention in any way.

Synthesis Example 1
Synthesis of Novolak Resin A 80 g of m-cresol, 120 g of p-cresol, 112 g of a 37 % formalin aqueous solution and 0.32 g of oxalic acid were charged in a 1-liter separable flask equipped with a stirrer, a condenser and a thermometer, and heated to 100° C. under stirring, followed by reacting for 16 hours. Thereafter, the temperature was raised to 200° C., and the pressure was gradually reduced to 1 mmHg to thereby remove water, unreacted cresol monomer, formaldehyde, oxalic acid, etc. Then, molten novolak resin was taken out of the flask and cooled to room temperature to solidify and recover the reaction product. Molecular weight of thus obtained novolak resin A was measured under the conditions described below according to gel permeation chromatography (GPC). Weight average molecular weight of the novolak resin A as determined using polystyrene standards was 6, 800. The dissolution rate of the novolak resin A for a 2.38 wt % aqueous solution of tetramethylammonium hydroxide measured by the aforementioned "method of measuring dissolution rate of novolak resin" was 199 Å/sec.

Measurement of the Novolak Resin According to GPC

Columns:GPC columns made by Showa Denko K.K. (one column of KF-804, two columns of KF-802 and one column of KF-801)

Flow rate:1.0 ml/min

Mobile phase: tetrahydrofuran (THF) for liquid chromatography grade

Column temperature: 40° C.

Synthesis Example 2

Synthesis of Radiation Sensitive Novolak Resin A 60 g of the novolak resin A, 6.71 g of 1,2-naphthoquinonediazide-4-sulfonyl chloride and 250 g of acetone were charged in a 1-liter, three-necked separable flask equipped with a stirrer, a dropping funnel and a thermometer, and stirred to completely dissolve. Then, the flask was dipped in an ice-bath till the temperature of the contents in the flask decreased to 15° C. and the ice-bath was removed. Then, 3.83 ml of triethylamine was dissolved in 25 ml of acetone and charged in the dropping funnel, then dropwise added to the mixture in the flask over one hour. After stirring for further 10 minutes, the contents inside the flask were filtered to remove triethylamine hydrochloride. Thereafter, the filtrate was gradually added dropwise to 4,000 ml of 0.1 N hydrochloric acid aqueous solution with starring to obtain a precipitate. This precipitate was washed with water, filtered out, and dried at 40° C. for 48 hours under reduced pressure to obtain radiation sensitive novolak resin A.

Synthesis Example 3

Synthesis of Radiation Sensitive Novolak Resin B

In the same manner as in Synthesis Example 2 except for changing 1,2-naphthoquinonediazide-4-sulfonyl chloride to 1,2-naphthoquinonediazide-5-sulfonyl chloride, there was obtained a radiation sensitive novolak resin B.

Examples 1 to 5, Comparative Example 1 to 5

50 g of a mixed radiation sensitive novolak resin, in which radiation sensitive novolak resins A and B prepared in the Synthesis Example 2 or 3 were respectively contained in the proportions shown in Table 1 below and 0.05 g of a surfactant of Megafac R-08 (manufactured by Dainippon Ink & Chemicals, Inc.) were dissolved in 80 g of a mixed solvent of ethyl lactate/n-butyl acetate (85/15). These solutions were filtered through a 0.5 µmTeflon filter and obtained positive-working radiation sensitive resin compositions of Examples 1 to 5 and Comparative Examples 1 to 5.

Thus obtained positive-working radiation sensitive resin compositions of Examples 1 to 5 and Comparative Examples 1 to 5 were respectively applied, exposed and developed to form positive resist patterns according to the method in the following "evaluation of radiation-sensitive resin composition" and then evaluated with respect to sensitivity, resolution, pattern form, scumming, and microgrooving characteristics according to the following evaluation. Results thus obtained are tabulated in Table 1.

(Evaluation of Radiation Sensitive Resin)

A positive-working radiation sensitive resin composition is applied on a HMDS-treated 4-inch silicon wafer using a spin coater, LARC ULTIMA-1000 made by Lithotec Japan Co. and pre-baked at 110° C. for 120 seconds on a hot plate to form an about 6 µm-thick resist coating. The thickness of the radiation sensitive resin coating is measured by means of a film thickness-measuring apparatus, Lambda Ace made by Dainippon Screen Co., Ltd. The silicon wafer is exposed using a g-line exposure apparatus having an exposure wavelength of 436 nm (DSW6400 made by GCA Co., Ltd., NA=0.42) or i-line exposure apparatus having an exposure wavelength of 365 nm (LD-5015iCW made by Hitachi Ltd., NA=0.50) with stepwise changing the exposure amount. After the exposure, the wafer is developed by dipping in an alkaline developer (AZ® 300MIF developer, a 2.38 wt-% aqueous solution of tetramethylammonium hydroxide) made by Clariant (Japan) K.K. at 23° C. for 5 minutes to obtain a positive resist pattern.

(1) Sensitivity

'Sensitivity' was assessed as an amount of exposure energy capable of forming isolated 1.2 µm space as designed by a reticle pattern when using a g-line exposure apparatus and an amount of exposure energy capable of forming isolated 1.0 µm space as designed by a reticle pattern when using an i-line exposure apparatus.

(2) Resolution

Minimum pattern dimension resolved by the exposure amount described in (1) above.

(3) Form of pattern

Cross-sectional form of the isolated space of resist patterns on the wafer is observed under a scanning electron microscope (SEM), and form of pattern is rated according to the following criteria:

○: No reduction of coating thickness observed, and increase of pattern dimension at a height of ⅔ of the resist coating thickness from the substrate being less than +10% based on the bottom dimension of the isolated space;

Δ: No reduction of coating thickness observed, and increase of the pattern dimension being +10% to less than +15%;

X: Increase of the pattern dimension being +15% or more, or some reduction of coating thickness observed.

(4) Scuming (development residue)

Pattern form of space patterns isolated at a critical resolution is observed under a scanning electron microscope (SEM), and scumming is rated according to the following criteria:

○: No development residues observed on the substrate and at the interface with resist pattern.

Δ: Slight development residues observed.

X: Considerable development residues observed.

(5) Microgrooving

Pattern form of space patterns isolated at the critical resolution is observed under a scanning electron microscope (SEM), and presence of microgrooving is rated according to the following criteria:

○: No under-cut of pattern observed at the interface between resist pattern and the substrate.

Δ: Slight under-cut of pattern observed.

X: Considerable under-cut of pattern observed.

TABLE 1

| | Radiation sensitive novolak resin | | Sensitivity (mJ/cm²) | | Resolution (μm) | | Pattern profile | | Scumming | Microgrooving |
|---|---|---|---|---|---|---|---|---|---|---|
| | Amount of A added | Amount of B added | g-line | i-line | g-line | i-line | g-line | i-line | g/i-line | g/i-line |
| Example 1 | 5.0 | 95.0 | 570 | 780 | 0.90 | 0.70 | ○ | ○ | ○ | ○ |
| Example 2 | 7.5 | 92.5 | 570 | 780 | 0.90 | 0.70 | ○ | ○ | ○ | ○ |
| Example 3 | 10.0 | 90.0 | 580 | 755 | 0.90 | 0.70 | ○ | ○ | ○ | ○ |
| Example 4 | 15.0 | 85.0 | 610 | 750 | 0.90 | 0.75 | ○ | ○ | ○ | ○ |
| Example 5 | 20.0 | 80.0 | 640 | 745 | 0.90 | 0.75 | ○ | ○ | ○ | ○ |
| Comparative Example 1 | — | 100.0 | 560 | 770 | 1.00 | 0.80 | ○ | ○ | X | X |
| Comparative Example 2 | 2.5 | 97.5 | 565 | 770 | 0.90 | 0.75 | ○ | ○ | Δ | ○ |
| Comparative Example 3 | 25.0 | 75.0 | 670 | 740 | 0.95 | 0.80 | ○ | Δ | ○ | ○ |
| Comparative Example 4 | 30.0 | 70.0 | 700 | 730 | 0.95 | 0.90 | Δ | Δ | ○ | ○ |
| Comparative Example 5 | 50.0 | 50.0 | 820 | 710 | 0.95 | 1.00 | Δ | Δ | ○ | Δ |

EFFECT OF THE INVENTION

As has been described in detail hereinbefore, high sensitivity, high resolution, no residues in development and ability to form excellent patterns, which cannot be predicted from the prior art can be attained by the positive-working radiation sensitive resin composition of the present invention using two kinds of specific naphtoquinonediazide-sulfonic acid esters in a specific proportion. And the positive-working radiation sensitive resin composition of the present invention is extremely useful as a resist material for manufacturing semiconductor integrated circuits, preparing a display surface of liquid crystal display panel, manufacturing a circuit substrate for thermal head etc., in these fields where being expected that miniaturization will proceed more and more hereafter.

INDUSTRIAL UTILITY

The positive-working radiation sensitive resin composition of the present invention can be used as a resist material in manufacturing semiconductor integrated circuits, preparing of display surface of LCD panel, manufacturing of circuit substrate of thermal heads and the like.

What is claimed is:

1. A positive-working radiation sensitive resin composition comprising a partially esterified product of an alkali-soluble novolak resin with o-naphthoquinonediazide compounds, wherein said partially esterified product comprises 1,2-naphthoquinonediazide-4-sulfonic acid ester and 1,2-naphthoquinonediazide-5-sulfonic acid ester, and the ratio by weight of the 4-sulfonyl group and 5-sulfonyl group bound to said partially esterified product ranges from 5:95 to 20:80.

2. The positive-working radiation sensitive resin composition according to claim 1 wherein the dissolution rate of the alkali-soluble novolak resin is in the range of 10 to 300 Å/sec. in 2.38 wt % aqueous solution of tetramethylammonium hydroxide.

* * * * *